US012658402B2

(12) United States Patent
Cook

(10) Patent No.: US 12,658,402 B2
(45) Date of Patent: Jun. 16, 2026

(54) MAGNETIC MULTIPOLE DEVICE, CHARGED PARTICLE BEAM APPARATUS, AND METHOD OF INFLUENCING A CHARGED PARTICLE BEAM PROPAGATING ALONG AN OPTICAL AXIS

(71) Applicant: ICT Integrated Circuit Testing Gesellschaft für Halbleiterprüftechnik mbH, Heimstetten (DE)

(72) Inventor: Benjamin Cook, Putzbrunn (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 813 days.

(21) Appl. No.: 17/940,660

(22) Filed: Sep. 8, 2022

(65) Prior Publication Data

US 2024/0087837 A1 Mar. 14, 2024

(51) Int. Cl.
*H01J 37/153* (2006.01)
*H01J 37/147* (2006.01)
*H01J 37/28* (2006.01)

(52) U.S. Cl.
CPC ........ *H01J 37/153* (2013.01); *H01J 37/1475* (2013.01); *H01J 37/28* (2013.01); *H01J 2237/1532* (2013.01); *H01J 2237/1534* (2013.01)

(58) Field of Classification Search
CPC ...... H01J 37/153; H01J 37/1475; H01J 37/28; H01J 2237/1532; H01J 2237/1534
See application file for complete search history.

(56) References Cited

U.S. PATENT DOCUMENTS

| | | | | | |
|---|---|---|---|---|---|
| 3,911,321 | A | * | 10/1975 | Wardly | H01J 37/1475 |
| | | | | | 315/364 |
| 2005/0035292 | A1 | * | 2/2005 | Adamec | H01J 37/1475 |
| | | | | | 250/311 |
| 2011/0163229 | A1 | * | 7/2011 | Frosien | H01J 37/28 |
| | | | | | 250/396 ML |
| 2013/0256552 | A1 | * | 10/2013 | Glavish | H01J 37/05 |
| | | | | | 250/396 ML |

OTHER PUBLICATIONS

Google Patent NPL search (Year: 2025).*

* cited by examiner

*Primary Examiner* — Georgia Y Epps
*Assistant Examiner* — Hanway Chang
(74) *Attorney, Agent, or Firm* — Kilpatrick Townsend & Stockton LLP

(57) ABSTRACT

A magnetic multipole device for influencing a charged particle beam propagating along an optical axis is provided. The magnetic multipole device includes a first magnetic deflector for deflecting the charged particle beam in an x-direction with a plurality of first saddle coils; and a second magnetic deflector for deflecting the charged particle beam in a y-direction perpendicular to the x-direction with a plurality of second saddle coils. The first and second saddle coils are arranged around the optical axis in a 12-pole magnetic corrector structure with 12 poles provided at uniformly spaced angular intervals. The 12-pole magnetic corrector structure is configured to exert a beam correction field of a magnetic 12-pole corrector on the charged particle beam. Further provided are a charged particle beam apparatus with a magnetic multipole device and a method of influencing a charged particle beam propagating along an optical axis with a magnetic multipole device as described herein.

20 Claims, 4 Drawing Sheets

MAGNETIC MULTIPOLE DEVICE, CHARGED PARTICLE BEAM APPARATUS, AND METHOD OF INFLUENCING A CHARGED PARTICLE BEAM PROPAGATING ALONG AN OPTICAL AXIS

TECHNICAL FIELD

Embodiments described herein relate to charged particle beam apparatuses, for example, for inspection system applications, testing system applications, lithography system applications, defect review or critical dimensioning applications, and particularly to electron beam inspection apparatuses, more particularly to scanning electron microscopes. Embodiments described herein further relate to magnetic multipole devices for influencing a charged particle beam in charged particle beam apparatuses as well as to methods of influencing a charged particle beam with a multipole device. Specifically, embodiments described herein relate to magnetic multipole devices and methods for influencing an electron beam in a specific manner, e.g., by deflecting and/or correcting the electron beam, particularly in electron beam inspection and imaging systems.

BACKGROUND

Modern semiconductor technology has created a high demand for structuring and probing specimens in the nanometer or even in the sub-nanometer scale. Micrometer and nanometer-scale process control, inspection or structuring, is often done with charged particle beams, e.g. electron beams, which are generated, shaped, deflected and focused in charged particle beam apparatuses, such as electron microscopes or electron beam pattern generators. For inspection purposes, charged particle beams offer a superior spatial resolution compared to, e.g., photon beams.

Inspection apparatuses using charged particle beams, such as scanning electron microscopes (SEM), have many functions in a plurality of industrial fields, including, but not limited to, inspection of electronic circuits during manufacturing, exposure systems for lithography, detecting systems, defect inspection tools, and testing systems for integrated circuits. In such particle beam systems, fine beam probes with a high current density can be used. For instance, in the case of an SEM, the primary electron beam generates signal particles like secondary electrons (SE) and/or backscattered electrons (BSE) that can be used to image, inspect and analyze a specimen.

Providing a compact charged particle beam apparatus adapted to quickly inspect a specimen is, however, challenging. Specifically, various scan deflectors, alignment deflectors, lenses, beam aberration correctors and/or other beam-optical components may be provided along the optical axis within a vacuum housing of the charged particle beam apparatus and may consume a considerable amount of space. However, space is typically limited in charged particle beam apparatuses, particularly in the area near the objective lens.

For directing a charged particle beam to a predetermined position on the specimen, beam deflectors can be provided that use electrostatic or magnetic fields to control the deflection of the charged particle beam from a first direction to a second direction. For example, bi-axial magnetic beam deflectors are able to deflect the beam in two orthogonal directions, e.g. in an x-y-plane perpendicular to the optical axis, and hence to a predetermined position on the specimen surface. However, most beam deflectors are known for introducing beam aberrations, such as astigmatism, when deflecting the charged particle beam, because beam deflectors are generally not rotationally symmetric with respect to the optical axis.

Astigmatism of a beam-optical device causes a charged particle beam to become deformed to an ellipsoidal-shaped cross section which may be problematic in high-resolution beam systems, since the beam probe of an astigmatic beam is larger than the beam probe of a non-astigmatic beam and has an extended line-focus instead of a small point-like focus.

For this reason, one or more beam aberration correctors are typically provided in addition to beam deflectors, in order to correct beam aberrations introduced by the beam deflectors and/or other beam aberrations for improving the obtainable resolution. For example, an 8-pole ("octupole") can be used as a stigmator, for compensating astigmatism in an arbitrary direction. However, a beam corrector separate from and in addition to a beam deflector may use a considerable space in a vacuum housing of a charged particle beam apparatus. An octupole can also be used as a beam deflector, if excited to generate a dipole field, however, the sensitivity of an octupole is limited and beam aberrations caused by a dipole field generated by an octupole can be considerable.

In view of the above, it would be beneficial to provide a compact multipole device adapted to flexibly and reliably influence a charged particle beam, particularly for bi-axially deflecting the charged particle beam and/or for correcting beam aberrations. Further, it would be beneficial to provide a method of flexibly and reliably influencing a charged particle beam in a charged particle beam apparatus, even if a restricted space is available. Finally, it would be beneficial to provide a charged particle beam apparatus adapted to influence a charged particle beam in a desired manner within a limited space, particularly for deflecting the charged particle beam to a predetermined position on the specimen and/or for correcting aberrations of the charged particle beam.

SUMMARY

In light of the above, a magnetic multipole device for influencing a charged particle beam propagating along an optical axis, a charged particle beam apparatus with a magnetic multipole device, and a method of influencing a charged particle beam propagating along an optical axis are provided according to the independent claims.

According to a first aspect, a magnetic multipole device for influencing a charged particle beam propagating along an optical axis is provided. The magnetic multipole device includes a first magnetic deflector for deflecting the charged particle beam in an x-direction, comprising a plurality of first saddle coils; and a second magnetic deflector for deflecting the charged particle beam in a y-direction perpendicular to the x-direction, comprising a plurality of second saddle coils. The plurality of first saddle coils and the plurality of second saddle coils are arranged around the optical axis in a 12-pole magnetic corrector structure with 12 poles provided in uniformly spaced angular intervals.

Specifically, the plurality of first saddle coils and the plurality of second saddle coils are arranged in a configuration of a magnetic 12-pole around the optical axis and are configured to exert a beam correction field of a magnetic 12-pole on the charged particle beam.

In some embodiments, the plurality of first saddle coils includes eight first saddle coils and the plurality of second saddle coils includes eight second saddle coils. Four saddle coils of the eight first saddle coils and four saddle coils of the eight second saddle coils may be respectively arranged in the same angular interval and overlap with each other, such that four "double coils" are provided. Each "double coil" may include a first saddle coil (i.e., a saddle coil of the plurality of first saddle coils) and a second saddle coil (i.e., a saddle coil of the plurality of second saddle coils) in alignment with each other, i.e. covering the same angular interval. Overall, a 12-pole magnetic corrector structure with 12 poles provided at uniformly spaced angular intervals may be provided by the first and second saddle coils of the first and second magnetic deflectors.

According to another aspect, a charged particle beam apparatus for imaging and/or inspecting a specimen with a charged particle beam, particularly with an electron beam, is provided. The charged particle beam apparatus can, for example, be an electron microscope, particularly an SEM. The charged particle beam apparatus includes a charged particle beam source for generating the charged particle beam, an objective lens for focusing the charged particle beam on the specimen, and a magnetic multipole device for influencing the charged particle beam, wherein the multipole device is configured in accordance with any of the embodiments described herein.

According to another aspect, a method of influencing a charged particle beam propagating along an optical axis is provided. The method includes guiding the charged particle beam through a magnetic multipole device that includes a first magnetic deflector with a plurality of first saddle coils and a second magnetic deflector with a plurality of second saddle coils, wherein the plurality of first saddle coils and the plurality of second saddle coils are arranged around the optical axis in a 12-pole magnetic corrector structure with 12 poles provided at uniformly spaced angular intervals. The method further includes one or both of (i) deflecting the charged particle beam in an x-y-plane by applying an x-deflection current to the first magnetic deflector and a y-deflection current to the second magnetic deflector, and (ii) correcting one or more beam aberrations of the charged particle beam by individually adjusting currents that flow through the 12 poles for exerting a beam correction field on the charged particle beam.

In some embodiments, each of the 12 poles of the 12-pole magnetic corrector structure may be provided by a first saddle coil, a second saddle coil, or a double coil comprising a first saddle coil overlapping with a second saddle coil. Optionally, the currents that flow through the 12 poles are individually adjusted, for example using variable resistors or potentiometers. For example, a respective variable resistor or potentiometer may be connected in parallel to at least some of the first and second saddle coils, particularly to twelve of the first and second saddle coils that are arranged at uniformly spaced angular intervals.

Embodiments are also directed at apparatuses for carrying out the disclosed methods and include apparatus parts for performing the individual method actions. This method may be performed by way of hardware parts, a computer programmed by appropriate software, by any combination of the two or in any other manner. Furthermore, embodiments are also directed at methods of operating the described apparatuses.

Further advantages, features, aspects and details that can be combined with embodiments described herein are evident from the dependent claims, the description and the drawings.

BRIEF DESCRIPTION OF THE DRAWINGS

So that the manner in which the above recited features of the present disclosure can be understood in detail, a more particular description, briefly summarized above, may be had by reference to embodiments. The accompanying drawings relate to one or more embodiments and are described in the following.

DETAILED DESCRIPTION

Reference will now be made in detail to the various embodiments, one or more examples of which are illustrated in the figures. Within the following description of the drawings, same reference numbers refer to same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

Figure 7:
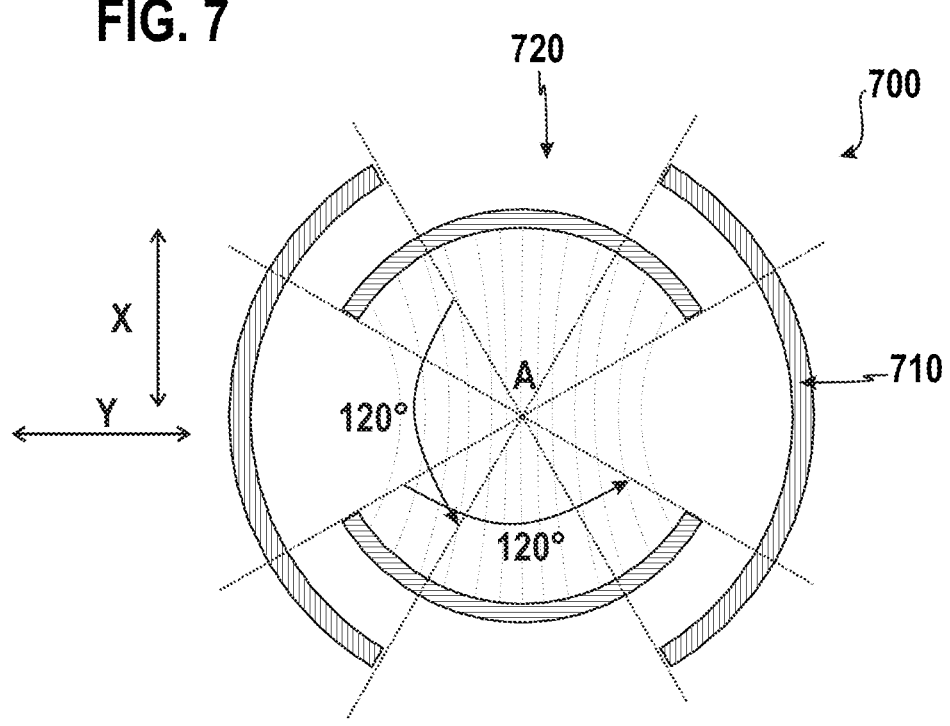
FIG. 7 is a schematic sectional view of a known biaxial saddle coil deflector.

FIG. 7 is a schematic view of a conventional bi-axial saddle coil deflector 700. The saddle coil deflector 700 includes a first pair of saddle coils 710 arranged on opposite sides of the optical axis A in a y-direction for deflecting the charged particle beam in an x-direction, and a second pair of saddle coils 720 arranged on opposite sides of the optical axis A in the x-direction for deflecting the charged particle beam in the y-direction. Each saddle coil is schematically depicted as a shaded ring segment in FIG. 7. Each saddle coil of the first and second pairs of saddle coils may cover an angle of about 120° around the optical axis, i.e., has an opening angle around the optical axis of about 120°.

Magnetic field lines generated by the second pair of saddle coils 720 are schematically indicated in FIG. 7. Saddle coil pairs with a large opening angle (of, e.g., 120° or more) in the circumferential direction provide a larger magnetic excitation area than coils with a smaller opening angle (of, e.g., 90° or less). Therefore, saddle coil pairs covering a large opening angle are advantageous with respect to deflection sensitivity per excitation current.

Further, oppositely arranged saddle coils with a respective opening angle of 120° do theoretically not generate any hexapole field and, therefore, cause less beam aberrations as compared to saddle coils having an opening angle different from 120°. Therefore, a "120° saddle coil deflector" is also beneficial due to a reduced beam aberration that is generated by the deflector.

However, beam aberrations, typically also astigmatism, may still be generated by the deflector and/or by other components of the charged particle beam apparatus, such that one or more beam aberration correctors may be beneficially provided in addition to the beam deflector, e.g., upstream or downstream thereof. For example, an electrostatic or magnetic octupole can be used as a stigmator for astigmatism compensation. Providing a corrector octupole in addition to a saddle coil deflector, however, increases the complexity and the space requirements in the vacuum housing of the charged particle beam apparatus. Using an octupole both for deflection and for aberration correction may also be problematic because the deflection sensitivity of an octupole is limited and considerable correction currents typically need to be superimposed on the deflection currents for compensating generated beam aberrations.

In view of the above, according to the embodiments described herein, a magnetic multipole device for influencing a charged particle beam propagating along an optical axis is provided that can be used (1) as a bi-axial saddle coil deflector and (2) as a magnetic dodecapole (12-pole) for compensating astigmatism and/or other beam aberrations. Further details of such a combined bi-axial saddle deflector and 12-pole magnetic corrector according to embodiments described herein are given below.

Figures 1, 2:
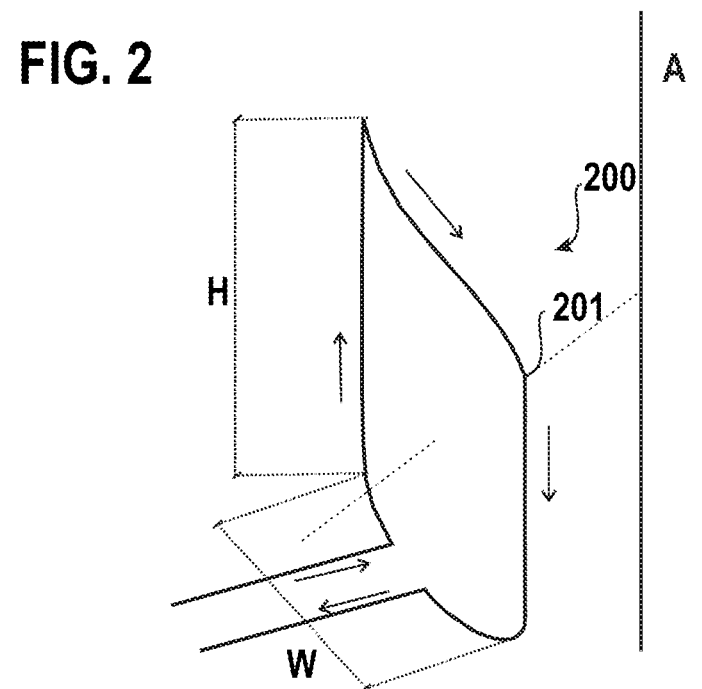
FIG. 1 shows a schematic view of a magnetic multipole device according to embodiments described herein in a sectional view perpendicular to the optical axis A, the magnetic multipole device being adapted for being operated according to any of the methods described herein.
FIG. 2 is a schematic perspective view of one saddle coil of a magnetic multipole device according to any of the embodiments described herein.

FIG. 1 shows a magnetic multipole device 100 according to embodiments described herein in a schematic sectional view in a sectional plane perpendicular to the optical axis A. The magnetic multipole device 100 includes a first magnetic deflector 110 for deflecting the charged particle beam in an x-direction, wherein the first magnetic deflector 110 includes a plurality of first saddle coils 112, particularly eight first saddle coils. The plurality of first saddle coils 112 may include two sets 111 of first saddle coils arranged on opposite sides of the optical axis A in the y-direction, such that the charged particle beam can be deflected in the x-direction by exciting the two sets 111 of first saddle coils with a first current.

The magnetic multipole device 100 further includes a second magnetic deflector 120 for deflecting the charged particle beam in a y-direction perpendicular to the x-direction, wherein the second magnetic deflector 120 includes a plurality of second saddle coils 122, particularly eight second saddle coils. The plurality of second saddle coils 122 may include two sets 121 of second saddle coils arranged on opposite sides of the optical axis A in the x-direction, such that the charged particle beam can be deflected in the y-direction by exciting the two sets 121 of second saddle coils with a second current. By exciting both the x-direction deflector and the y-direction deflector simultaneously with respective currents, the charged particle beam can be deflected to a predetermined position on a specimen surface in the x-y-plane.

As is schematically depicted in FIG. 1, the plurality of first saddle coils 112 and the plurality of second saddle coils 122 are arranged around the optical axis A in a configuration of a 12-pole corrector (=a magnetic dodecapole) that has 12 poles provided at essentially uniformly spaced angular intervals. The 12 poles may respectively be provided by a first saddle coil of the plurality of first saddle coils, by a second saddle coil of the plurality of second saddle coils, or by a "double coil" that includes a first saddle coil overlapping with a second saddle coil, i.e., provided in essentially the same angular interval.

Different from the known bi-axial saddle coil deflector of FIG. 7 that includes two pairs of oppositely arranged saddle coils, the bi-axial saddle coil deflector of FIG. 1 includes two pluralities of saddle coils, each plurality including two sets of oppositely arranged saddle coils, particularly wherein each set includes four saddle coils arranged close to each other in the circumferential direction U. Overall, the two pluralities of saddle coils are arranged to provide a magnetic dodecapole-corrector structure adapted for beam aberration correction, particularly by generating a magnetic correction field of a 12-pole. Therefore, according to the embodiments described herein, the advantages of a bi-axial saddle coil deflector and of a 12-pole magnetic corrector are combined in a single magnetic multipole device that can act as a bi-axial saddle coil deflector and/or as a magnetic 12-pole, subsequently, alternately or simultaneously.

FIG. 2 is a schematic view of one saddle coil 200 of a magnetic multipole device according to any of the embodiments described herein. The saddle coil 200 (also referred to as a saddle-like coil) is schematically depicted in a perspective view. The other saddle coils of the magnetic multipole device may be configured similarly or correspondingly around the optical axis.

Generally, saddle coils are known to the skilled person in the field of magnetic deflectors in charged particle beam apparatuses. A saddle coil 200 includes one or more windings 210 wound around a coil axis that extends essentially radially from the optical axis A. A saddle coil is different from a toroidal coil whose coil axis extends around the optical axis A in the circumferential direction U. The one or more windings 201 of the saddle coil 200 may form one or more loops around the coil axis on a surface of a (virtual or real) cylindrical structure that is coaxial the optical axis A (see also FIG. 3 in this respect). The saddle coils may have a coil height (H) in a direction along the optical axis and a coil width (W) in the circumferential direction. For example, the saddle coils may be self-supportingly arranged, or the saddle coils may be arranged or mounted on a surface of a support structure that may surround the optical axis A.

With a current running through two sets of saddle coils that are arranged on opposite sides of the optical axis, a magnetic dipole field can be generated between the two sets of oppositely arranged saddle coils which has a direction essentially perpendicular to the optical axis A along which the charged particle beam propagates, such that the charged particles of the charged particle beam can be deflected with respect to an initial propagation direction. The deflection direction is generally perpendicular to the direction of the magnetic field lines and perpendicular to the propagation direction of the charged particles, such that the propagation direction of the charged particles is changed by a predetermined angle.

It is to be noted that a (virtual or real) cylindrical structure on which the saddle coils can be arranged is to be understood in a broad sense, i.e., referring to any structure that is coaxial with respect to the optical axis A and which has a predetermined length along the optical axis A. For example, the cylindrical structure may be a cylinder, a cone-like structure, a shell-like structure, a cylinder with a polygonal base structure such as a regular 12-corner polygon or any shape combining these or similar structures. Saddle-like coils on side surfaces of, e.g., a parallelepiped structure result in "flat" coils since the windings are respectively arranged in a "flat" plane instead of on a curved surface. For example, the saddle coils may respectively have a curvature around the optical axis (as the saddle coil 200 schematically shown in FIG. 2) or the saddle coils may respectively have essentially flat coil windings.

Returning to FIG. 1, in some embodiments, which can be combined with other embodiments described herein, the plurality of first saddle coils 112 of the first magnetic deflector 110 may include eight first saddle coils, particularly two sets of four adjacently arranged first saddle coils, and/or the plurality of second saddle coils 122 of the second magnetic deflector 120 may include eight second saddle coils, particularly two sets of four adjacently arranged second saddle coils, as is schematically depicted in FIG. 1. Accordingly, the magnetic multipole device may include sixteen saddle coils, the sixteen saddle coils being arranged in a configuration of a 12-pole magnetic corrector structure.

Arranging 16 coils in a setup of a magnetic 12-pole is possible, for example, by providing four of the eight first saddle coils in respective same angular intervals as four of the eight second saddle coils, particularly one behind the other in a radial direction, such that four "double coils" are provided. Each of the four "double coils" may include one of the first coils and one of the second coils arranged radially behind one another in a same angular interval.

In some implementations, each of the 12 poles of the 12-pole magnetic corrector structure may provided by a first saddle coil of the plurality of first saddle coils, by a second saddle coil of the plurality of second saddle coils, or by a double coil that includes a first saddle coil overlapping with a second saddle coil. In particular, as is depicted in FIG. 1, every third pole of the 12 poles (e.g., poles (1), (4), (7), (10) in FIG. 1) may be provided as a double coil, and the remaining eight poles of the twelve poles may be provided by a first saddle coil or by a second saddle coil, respectively.

The 12 poles of the 12-pole magnetic corrector structure may be provided in uniformly spaced angular intervals of about 30°, respectively, such that the 12 poles substantially surround the optical axis A in the circumferential direction U, each pole covering an essentially corresponding angular range.

In some embodiments, which can be combined with other embodiments described herein, the 12 poles are configured to exert a beam correction field of a magnetic 12-pole corrector on the charged particle beam for correcting astigmatism and/or other beam aberrations of the charged particle beam. In particular, the current that flows through each of the 12 poles may be individually adjustable, such that a predetermined magnetic 12-pole field can be exerted on the charged particle beam.

The one or more beam aberrations that are corrected by the magnetic 12-pole corrector may include any one or more of astigmatism, other beam aberration(s), and/or inaccuracies in the beam propagation or deflection angle. In particular, the magnetic 12-pole corrector may be used for fine deflection of the charged particle beam, while coarse deflection can be carried out by the first and second magnetic deflectors which can be controlled by a deflection controller, e.g., an x-deflection controller and a y-deflection controller.

For the poles that are constituted as "double coils" (e.g., the poles (1), (4), (7), (10) in FIG. 1), it may be sufficient that the current that flows through one of the coils of the respective double coil is individually adjustable. In this case, an individual current control device, e.g. a variable resistor and/or adjustable current supply, may be connected to only one of the coils of each double coil. In particular, the current that flows through each of 12 saddle coils arranged at uniformly spaced angular intervals may be individually adjustable. Alternatively, the current that flows through each of the first and second saddle coils of the magnetic multipole device may be individually adjustable, e.g. by connecting each of the saddle coils to an individual current control device, e.g., a variable resistor and/or adjustable current supply. Specifically, the current flowing through each of the two coils of a double coil may be individually adjustable.

As is schematically depicted in FIG. 1, the plurality of first saddle coils 112 of the first magnetic deflector includes two sets 111 of first saddle coils arranged on opposite sides of the optical axis in the x-direction, each set of first saddle coils including four first saddle coils arranged next to each other in the circumferential direction. The two sets 111 of first saddle coils are depicted hatched in FIG. 1. The plurality of second saddle coils of the second magnetic deflector may include two sets 121 of second saddle coils arranged on opposite sides of the optical axis in the y-direction, each set of second saddle coils including four second saddle coils arranged next to each other in the circumferential direction. The two sets 121 of second saddle coils are depicted without hatching in FIG. 1. Accordingly, by exciting the two sets 111 of oppositely arranged first saddle coils with an x-deflection current, a magnetic dipole field that leads to a beam deflection in the x-direction is generated, and by exciting the two sets 121 of oppositely arranged second saddle coils with a y-deflection current, a magnetic dipole field that leads to a beam deflection in the y-direction is generated. The two magnetic deflection fields can be superimposed, which leads to a beam deflection to a predetermined position in the x-y-plane.

In some implementations, each set 111 of first saddle coils covers an angle between 110° and 130°, particularly of about 120°, in the circumferential direction. Alternatively or additionally, each set 121 of second saddle coils covers an angle between 110° and 130°, particularly of about 120°, in the circumferential direction. A magnetic deflection field that is generated by two oppositely arranged sets of saddle coils, the adjacently arranged saddle coils of each set together covering an angle of about 120°, is generally similar to the magnetic deflection field that is generated by two oppositely arranged saddle coils as shown in FIG. 7, each single saddle coil covering an angle of 120°. Accordingly, no hexapole field component or only a small hexapole field component is generated by the sets of saddle coils, such that beam aberrations, particularly astigmatism, generated by the magnetic deflector can be kept low.

In some embodiments, the two sets 111 of first saddle coils and the two sets 121 of second saddle coils overlap, with an overlap angle in the circumferential direction of about 30° in four overlap areas 125, respectively. In each overlap area a double coil that includes a first saddle coil in alignment with a second saddle coil is arranged. In particular, each set 111 of first saddle coils may include two outer first saddle coils and two inner first saddle coils, and each set 121 of second saddle coils may include two outer second saddle coils and two inner second saddle coils. Each outer first saddle coil may overlap with a respective outer second saddle coil and be arranged in a corresponding angular interval, such that four double coils are provided in the four overlap areas 125. The distance between the two saddle coils of a double coil in a radial direction may be small, typically 1 cm or less, particularly 5 mm or less, more particularly 1 mm or less, or even 0.5 mm or less.

In some embodiments, which can be combined with other embodiments described herein, each saddle coil of the pluralities of first and second saddle coils may cover an angle in the circumferential direction of 20° or more and 40° or less, particularly about 30°. For example, the saddle coils themselves may respectively have an opening angle in the circumferential direction between 20° and 28°, and angular gaps between 2° and 10° may be provided between two saddle coils that are adjacent to each other in the circumferential direction, respectively. In the exemplary implementation of FIG. 1, each saddle coil has an opening angle of about 28°, and a circumferential gap of about 2° is provided between adjacent saddle coils, respectively. In particular, two adjacent saddle coils may be arranged close to each other in the circumferential direction, with a gap of 5° or less therebetween, but typically without touching each other. By arranging twelve saddle coils around the optical axis, each covering an angle in the circumferential direction of about 30°, a 12-pole magnetic corrector structure can be provided. As explained above, double coils may be provided in four overlap areas 125, such that at the same time the general structure of a 120° saddle coil deflector for bi-axial deflection can be provided.

In some embodiments, which can be combined with other embodiments described herein, the plurality of first saddle coils is arranged coaxially inside, or alternatively coaxially outside, the plurality of second saddle coils of the second magnetic deflector. In other words, the plurality of first saddle coils may be arranged essentially on a circular curve around the optical axis A with a first diameter (D1), and the plurality of second saddle coils may be arranged essentially on a circular curve with a second diameter (D2) different from the first diameter (see FIG. 3 in this respect). A difference between the first diameter (D1) and the second diameter (D2) may be, for example, 2 cm or less, particularly 1 cm or less, more particularly 2 mm or less, or even 1 mm or less. Accordingly, the first saddle coils of the first magnetic deflector and the second saddle coils of the second magnetic deflector are spatially separated from each other in a radial direction and it can be immediately identified to which one of the first magnetic deflector 110 and the second magnetic deflector 120 any of the saddle coils belong. Arranging the first saddle coils and the second saddle coils along different circular curves facilitates the electrical connection and the control of the first and second magnetic deflectors to enable a predetermined deflection in the x- and y-directions. Further, when the pluralities of first and second saddle coils are arranged at different distances from the optical axis, a partial overlap in the circumferential direction is possible, such that the structure of a 120° saddle coil deflector for bi-axial deflection can be provided.

The magnetic multipole device according to embodiments described herein enables a bi-axial magnetic deflection and an aberration correction of a charged particle beam at one position along the optical axis A, since the first magnetic deflector and the second magnetic deflector are provided at the same position (in corresponding sectional planes) along the optical axis A. The space requirements can be reduced and spatially separated devices for beam deflection and beam correction may not be necessary. A single magnetic multipole device can be used for beam deflection and aberration correction, e.g. simultaneously. Further, considering the large opening angle of each set of saddle coils, particularly of about 120°, the deflection sensitivity is large which means that the ratio between the excitation current and the obtainable deflection angle is small. For example, the deflection sensitivity of a 120° saddle coil deflector is about 20° higher when compared to the deflection sensitivity of an octupole deflector.

Figure 3:
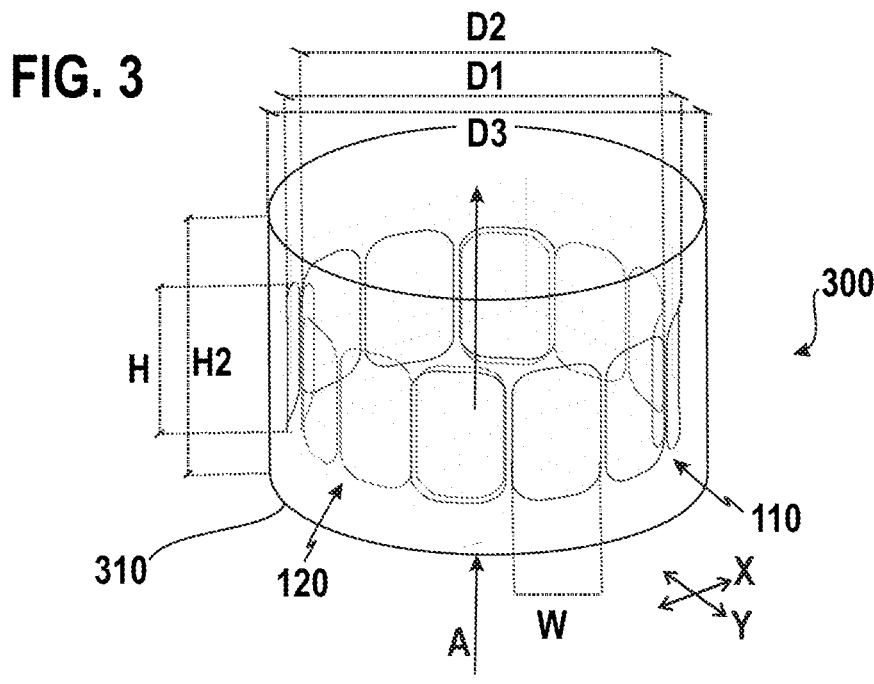
FIG. 3 is a schematic perspective view of a magnetic multipole device according to embodiments described herein.

FIG. 3 is a schematic perspective view of a magnetic multipole device 300 according to embodiments described herein. The magnetic multipole device 300 of FIG. 3 may include some features or all the features of the magnetic multipole device 100 of FIG. 1, such that reference can be made to the above explanations, which are not repeated here. In particular, the magnetic multipole device may include a first magnetic deflector 110 with a plurality of first saddle coils for x-deflection and a second magnetic deflector 120 with a plurality of second saddle coils for y-deflection, the first and second saddle coils being arranged around the optical axis A in a configuration of a 12-pole magnetic corrector. In some embodiments, eight first saddle coils and eight second saddle coils are provided.

In some embodiments, each of the first and second saddle coils may be provided in an angular interval of about 30° and may cover an angle between, e.g., 20° and 40°.

As is schematically depicted in FIG. 3, the plurality of first saddle coils may be arranged on a circular line with a first diameter (D1) around the optical axis A, and the plurality of second saddle coils may be arranged on a circular line with a second diameter (D2) different from the first diameter (D1). For example, the first diameter D1 may be 4 mm or more and 100 mm or less, and the second diameter D2 may be slightly smaller or slightly larger than that.

In some embodiments, which can be combined with other embodiments described herein, the first saddle coils and the second saddle coils may have a respective coil height (H) along the direction of the optical axis of 5 mm or more and 200 mm or less, particularly 10 mm or more and 50 mm or less. In some embodiments, the first saddle coils and the second saddle coils may have a respective coil width (W) in the circumferential direction of 1 mm or more and 26 mm or less, particularly 3 mm or more and 15 mm or less. Saddle coils with such dimensions are suitable for generating an appropriate magnetic field for deflection and aberration correction.

In some embodiments, which can be combined with other embodiments described herein, the magnetic multipole device 300 may further include a shielding 310 that coaxially surrounds the first and second saddle coils of the first and second magnetic deflector. For example, the shielding 310 may have a cylindrical shape that coaxially encloses the first and second magnetic deflectors and surrounds the optical axis A. In particular, the shielding 310 may be formed as a circular cylinder made of a shielding material, such as a metal. In some implementations, the shielding 310 may have a third diameter D3 that is larger than the diameters of the first and second magnetic deflectors. For example, a radial distance between the shielding 310 and at least some of the saddle coils may be 10 mm or less, particularly 5 mm or less, e.g., between 1 mm and 4 mm.

The shielding 310 may have a shielding height (H2), i.e. a dimension of the shielding along the optical axis A. The shielding height (H2) may be larger than the coil height (H) of the pluralities of first and second saddle coils along the optical axis, such that the first and second coils may be completely surrounded by the shielding 310. In particular, the shielding height (H2) may be at least twice the coil height (H), as is schematically depicted in FIG. 3. The shielding 310 may provide an electromagnetic shielding. In particular, an electromagnetic field may be reduced or blocked by the shielding, such that the magnetic field generated by the first and second magnetic deflectors in the surroundings of the magnetic multipole (e.g., radially outside the magnetic multipole device) can be limited. A negative effect of the magnetic multipole device on other components as well as an influence of external fields on the charged particle beam can be reduced. The deflection and correction accuracies can be improved.

Figure 4:
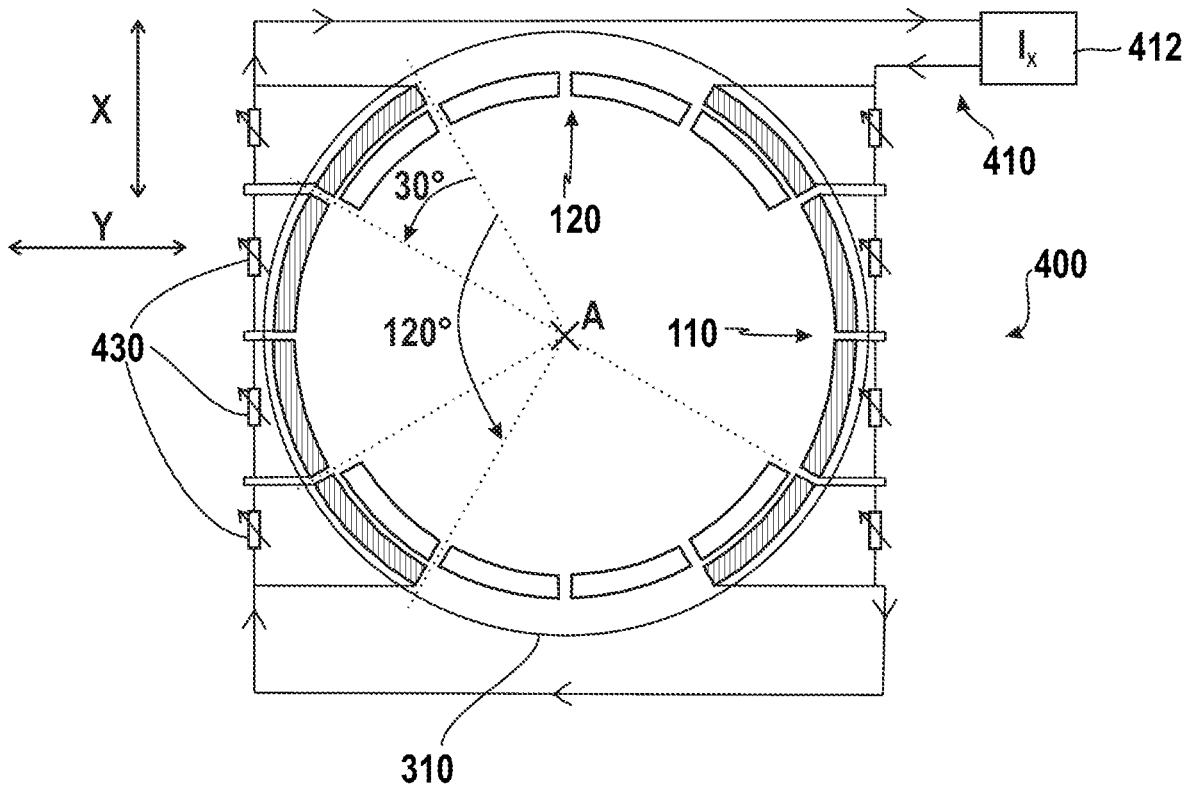
FIG. 4 shows a schematic view of a magnetic multipole device according to embodiments described herein in a sectional view perpendicular to the optical axis A, the magnetic multipole device being adapted for being operated according to any of the methods described herein.

FIG. 4 is a schematic view of a magnetic multipole device 400 according to embodiments described herein in a sectional view perpendicular to the optical axis A. The magnetic multipole device can be operated according to any of the methods described herein. The magnetic multipole device 400 may include some of the features or all the features of the magnetic multipole device 100 of FIG. 1, such that reference can be made to the above explanations, which are not repeated here.

The magnetic multipole device 400 includes the first magnetic deflector with the plurality of first saddle coils (depicted with hatching) and the second magnetic deflector with the plurality of second saddle coils (depicted without hatching). Each of the first and second magnetic deflectors may include two oppositely arranged sets of four saddle coils, each set covering an angle of about 120°. The pluralities of first and second saddle coils are arranged in a configuration of a 12-pole magnetic corrector. In particular, four of the twelve poles may be provided as "double coils" including a respective first saddle coil overlapping with a respective second saddle coil, and/or eight of the twelve poles may be provided as "single coils" including only a first saddle coil or only a second saddle coil.

In some embodiments, which can be combined with other embodiments described herein, the plurality of first saddle coils may be connected to x-deflection current terminals 410 of a current supply 412. The x-deflection current terminals 410 may provide an x-deflection current adapted to excite a predetermined dipole deflection field between the two oppositely arranged sets of first saddle coils to cause a predetermined beam deflection in the x-direction. An x-deflection controller may optionally be provided for adjusting/setting the x-deflection current as appropriate for obtaining a predetermined x-deflection angle, e.g., for slow beam deflection or for quick beam scanning, e.g., in a raster-scan pattern together with a superimposed y-deflection and/or for a "jump" of the charged particle beam to a particular point on the substrate or a beam shift.

The plurality of first saddle coils, or at least a subset thereof, may be connected to the x-deflection current terminals 410 in a series connection. In the embodiment of FIG. 4, the first saddle coils of the first magnetic deflector are all connected in series to the x-deflection current terminals 410. A series connection of the first saddle coils with the current supply provides the advantage that generally identical or similar x-deflection currents flow to each coil of the plurality of first saddle coils, facilitating the electrical connection of the plurality of first saddle coils and ensuring the generation of an x-deflection dipole field by the plurality of first saddle coils. The current that actually flows through the first saddle coils, or at least through a subset thereof, can be individually adjusted by respective individual current control devices, e.g. variable resistors, as described in further detail below.

In some embodiments, which can be combined with other embodiments described herein, the plurality of second saddle coils may be connected to y-deflection current terminals of the current supply 412 or of another current supply. The y-deflection current terminals and the connection lines connecting the second saddle coils to the y-deflection current terminals are not depicted in FIG. 4 for the sake of better clarity. Only the x-deflection current terminals 410 and the respective connection lines are schematically illustrated.

The y-deflection current terminals may provide a y-deflection current adapted to excite a predetermined dipole deflection field between the two oppositely arranged sets of second saddle coils for causing a predetermined beam deflection in the y-direction. A y-deflection controller may optionally be provided for adjusting/setting the y-deflection current as appropriate for obtaining a predetermined y-deflection, e.g., for slow beam deflection or for quick beam scanning, e.g., in a raster-scan pattern together with a superimposed x-deflection and/or for a "jump" of the charged particle beam to a particular point on the substrate or a beam shift.

The plurality of second saddle coils, or at least a subset thereof, may be connected to the y-deflection current terminals in a second series connection (not depicted in FIG. 4, but similar to the series connection of the plurality of first saddle coils). A series connection of the second saddle coils with same y-deflection current terminals provides the advantage that generally same or similar y-deflection currents flow to each coil of the plurality of second saddle coils, facilitating the electrical connection of the plurality of second saddle coils and ensuring the generation of a y-deflection dipole field by the plurality of second saddle coils. The current that actually flows through the second saddle coils, or at least through a subset thereof, can be individually adjusted by respective individual current control devices, e.g. variable resistors, as described in further detail below.

In some embodiments, which can be combined with other embodiments described herein, the magnetic multipole device is configured to correct one or more beam aberrations of the charged particle beam by individually adjusting currents that flow through the 12 poles of the 12-pole magnetic corrector structure. In particular, the current flowing through the saddle coil(s) that constitute the 12 poles can be individually adjusted, e.g. by respective current control devices, particularly (but not necessarily) by respective variable resistors or potentiometers.

Typically, beam correction currents are considerably smaller as compared to beam deflection currents. Therefore, it is beneficial to connect the saddle coils of a magnetic deflector to the same current terminals which provide the general deflection current. The general deflection current can then be individually adjusted at each of the 12 poles of the 12-pole magnetic corrector structure for correcting beam aberrations, particularly via a plurality of current control devices, such as variable resistors or potentiometers.

In particular, in some embodiments, the 12 poles may be respectively provided by a first saddle coil, by a second saddle coil, or by a double coil, and an adjustable resistor or potentiometer 430 may be connected in parallel to each of the 12 poles for individually adjusting a current that flows therethrough. For example, 12 variable resistors or potentiometers may be provided, one at each pole. The resistance values provided by each of the variable resistors or potentiometers can be controlled by a 12-pole controller. For example, a 12-pole controller may set the resistance values of the variable resistors or potentiometer as appropriate for providing a respective beam correction field.

In some embodiments, an adjustable resistor or potentiometer 430 may respectively be connected in parallel to the first saddle coils and to the second saddle coils that are provided as single coils (i.e., that are not a part of a double coil) and to one of the coils of each double coil. In the exemplary embodiment of FIG. 4, an adjustable resistor or potentiometer 430 is connected in parallel to each of the eight first saddle coils and to the four second saddle coils that are provided as single coils. Alternatively, each of the saddle coils may be provided with a variable resistor that is connected in parallel thereto. In some embodiments, each of the 12 poles includes at least one saddle coil with a variable resistor or another current control device which may be connected in parallel thereto.

In some embodiments, which can be combined with other embodiments described herein, the magnetic multipole device is configured to bi-axially deflect the charged particle beam in an x-y-plane by exciting the first magnetic deflector with an x-deflection current and the second magnetic deflector with a y-deflection current. The magnetic multipole device may be configured to, simultaneously with the deflection, correct one or more beam aberrations of the charged particle beam by individually adjusting currents flowing through the pluralities of first and second saddle coils, or at least a subset thereof, for generating a predetermined beam correction field. The currents may optionally be individually adjusted via variable resistors or potentiometers connected in parallel to respective saddle coils that form the 12 poles of the 12-pole magnetic corrector structure. Optionally, a 12-pole controller may be provided for adjusting the resistance values of the variable resistors or potentiometers, such that a predetermined beam correction field superimposed on the bi-axial deflection field can be applied to the charged particle beam.

In some embodiments, a 12-pole controller may be provided for setting or adjusting the resistance values of the variable resistors or potentiometers, such that the beam correction that is obtained by the 12 poles of the 12-pole magnetic corrector structure can be set or adjusted by the 12-pole controller. An x-deflection controller and a y-deflection controller (which may be combined in a single device) may be provided for setting or adjusting the x-deflection current and the y-deflection current and thus for setting or adjusting the beam deflection. In some embodiments, the 12-pole controller may adjust the currents flowing through the 12 poles such as to obtain a fine deflection and/or an aberration correction while a coarse beam deflection may be set by the x-/y-deflection controllers.

In some embodiments, which can be combined with other embodiments described herein, the deflection can be fast and the correction can be slow. Specifically, the 12-pole corrector (which may control the resistance values associated to the 12 poles) may slowly vary the resistance values, while the x-/y-deflection controllers may quickly vary the x-/y-deflection currents. For example, the beam deflection (caused by the x- and-deflection currents) may be varied quickly (e.g., for beam scanning) while the resistance values of the variable resistors may remain at least temporarily constant or may vary more slowly. In particular, the resistance values may remain constant during the generation of an image or during the scanning of the charged particle beam along a line, while the beam deflection current may be varied, e.g. for quick beam scanning and/or deflection. In some implementations, the 12-pole controller may be configured for slower output signals as the x-/y-deflection controllers, e.g., the 12-pole controller may be configured for slow signal variations and the x-/y-deflection controllers can be configured for quick signal variations.

In some embodiments, the first and second magnetic deflectors may be surrounded by a shielding 310.

Figure 5:
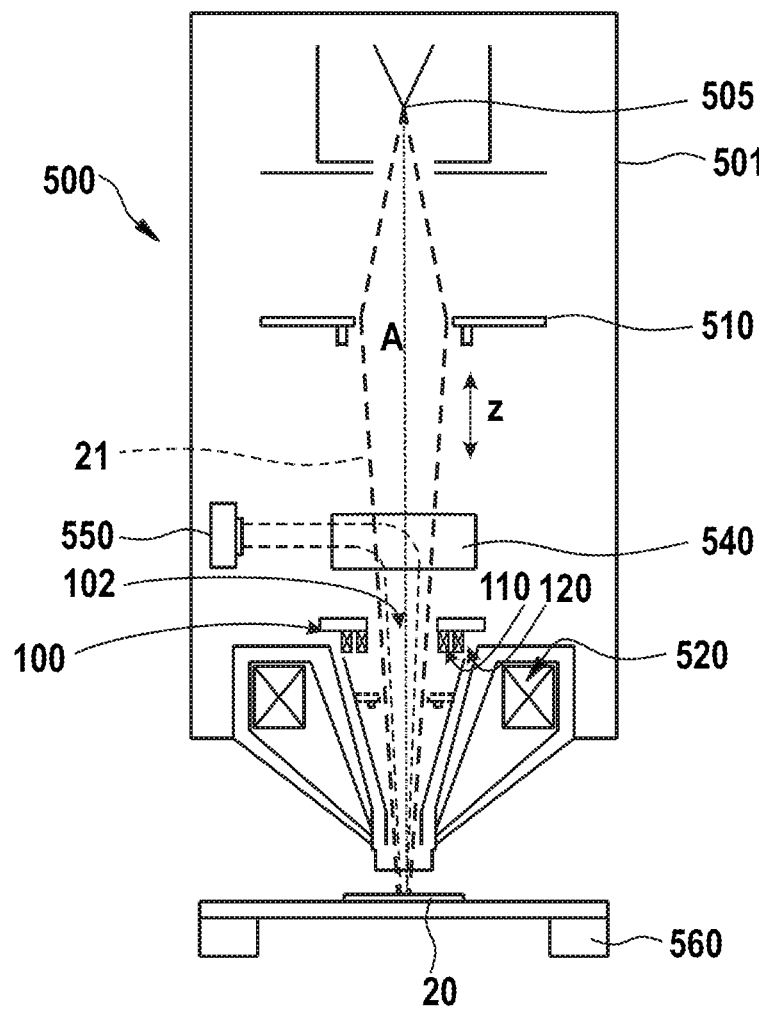
FIG. 5 is a schematic view of a charged particle beam apparatus according to any of the embodiments described herein.

FIG. 5 is a schematic view of a charged particle beam apparatus 500 according to any of the embodiments described herein in a schematic sectional view. The charged particle beam apparatus 500 may be configured for inspecting and/or imaging a specimen 20 with a charged particle beam 21, particularly with an electron beam. In some embodiments, the charged particle beam apparatus 500 is an electron microscope, particularly a scanning electron microscope (SEM).

The charged particle beam apparatus 500 includes a charged particle beam source 505 for generating the charged particle beam 21 propagating along an optical axis A. The charged particle beam source 505 may be an electron source, e.g., a cold field emitter (CFE), a thermal field emitter (TFE) or another type of electron source.

The charged particle beam apparatus 500 further includes an objective lens 520 for focusing the charged particle beam 21 on the specimen 20 that may be placed on a specimen stage 560. The objective lens 520 may be a magnetic objective lens, an electrostatic objective lens, or a combined magnetic-electrostatic objective lens.

The specimen 20, e.g., a wafer, an electronic circuit, or another substrate to be inspected, may be placed on the specimen stage 560. The specimen stage 560 may be movable in the plane of the specimen, i.e. in the x-y-plane, and/or in the direction z of the optical axis A.

The charged particle beam apparatus 500 may include a vacuum housing 501 in which the beam-optical components of the charged particle beam apparatus 500 are arranged. The vacuum housing 501 can be evacuated to a sub-atmospheric pressure below 1 mbar, e.g. $10^{-5}$ mbar or less.

The charged particle beam apparatus 500 may optionally include further beam-optical components, such as a condenser lens 510 for collimating the charged particle beam 21, one or more aberration correctors for correcting beam aberrations, a beam separator 540 for separating signal particles (e.g., secondary electrons SEs and/or backscattered electrons BSEs) generated upon impingement of the charged particle beam 21 on the specimen 20 from the charged particle beam 21, and/or a detector 550 for detecting the signal particles.

The charged particle beam apparatus 500 further includes a magnetic multipole device 100 for influencing the charged particle beam 21 according to any of the embodiments described herein. The magnetic multipole device 100 may be arranged such that the optical axis A extends through a central opening 102 of the magnetic multipole device 100.

In some embodiments, which can be combined with other embodiments described herein, the magnetic multipole device 100 may be arranged adjacent to or within the objective lens 520. Arranging the magnetic multipole device 100 close to, or even at least partially in the objective lens 520 may be beneficial because larger deflection angles may be possible if the magnetic multipole device 100 is arranged close to the specimen 20. A charged particle beam apparatus with a large field of view (FOV) can be provided. FIG. 5 shows the magnetic multipole device 100 at a position upstream of the objective lens, e.g., at a distance of 2 cm or less from the objective lens. Further, an alternative position of the magnetic multipole device 100 in the objective lens 520 is illustrated in dashed lines in FIG. 5. A distance between the magnetic multipole device 100 and the objective lens 520 along the optical axis A may be 5 cm or less, such that an electron beam inspection apparatus with a large FOV can be provided.

Alternatively or additionally, the magnetic multipole device 100 or a second magnetic multipole device may be arranged at another position along the optical axis, e.g., upstream or downstream of the condenser lens 510.

In some embodiments, which can be combined with other embodiments described herein, the magnetic multipole device 100 is configured to deflect the charged particle beam to a region of interest of the specimen by applying a magnetic deflection field with the first and second magnetic deflectors on the charged particle beam. Further, the magnetic multipole device 100 is configured to exert a beam correction field of a magnetic 12-pole corrector on the charged particle beam for correcting one or more beam aberrations of the charged particle beam, particularly for correcting astigmatism.

Figure 6:
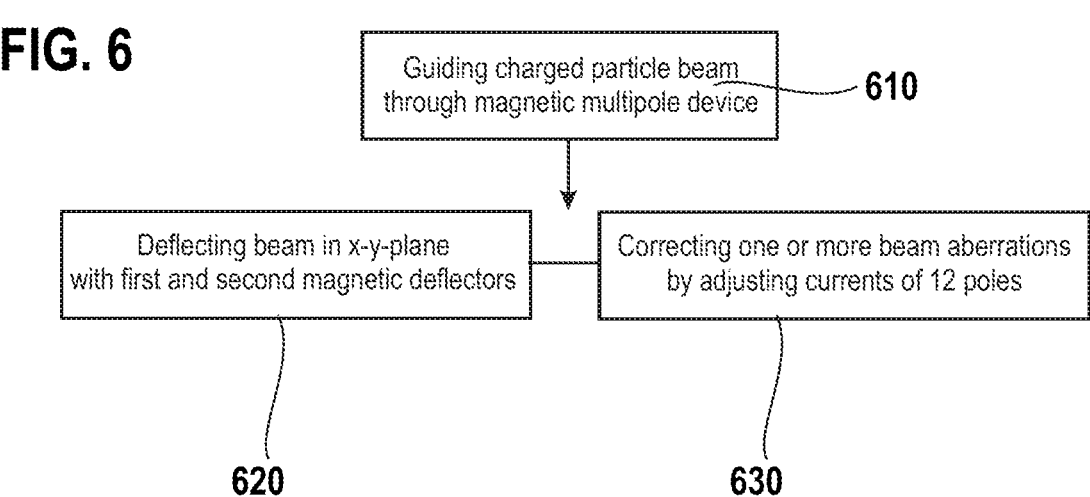
FIG. 6 is a flow diagram that illustrates a method of influencing a charged particle beam according to any of the embodiments described herein.

FIG. 6 is a flow diagram that illustrates a method of influencing a charged particle beam according to any of the embodiments described herein.

In box 610, the method includes guiding the charged particle beam through a central opening of a magnetic multipole device that includes a first magnetic deflector with a plurality of first saddle coils and a second magnetic deflector with a plurality of second saddle coils, wherein the plurality of first saddle coils and the plurality of second saddle coils are arranged around the optical axis in a 12-pole magnetic corrector structure with 12 poles. In some embodiments, the 12 poles are arranged in uniformly spaced angular intervals, particularly each pole covering an angular interval of about 30°.

The method further includes any one or both of (i) and (ii), wherein (i) and (ii) may be carried out subsequently or simultaneously: (i) In box 620, deflecting the charged particle beam in an x-y-plane by applying an x-deflection current to the first magnetic deflector and a y-deflection current to the second magnetic deflector, and (ii), in box 630, correcting one or more beam aberrations of the charged particle beam by individually adjusting currents that flow through the 12 poles of the 12-pole magnetic corrector structure for exerting a beam correction field on the charged particle beam.

In some embodiments, the 12 poles of the 12-pole magnetic corrector structure are respectively provided by a first saddle coil of the plurality of first saddle coils, by a second saddle coil of the plurality of second saddle coils, or by a double coil that includes a first saddle coil overlapping with a second saddle coil, particularly in circumferential alignment with each other. The currents that flow through the 12 poles can be individually adjusted, particularly via variable resistors or potentiometers that may optionally be connected in parallel to the respective saddle coil(s) that form the 12 poles. In some implementations, which can be combined with other implementations, the x-deflection current and/or the y-deflection current may be varied with a first variation speed, and resistance values of the variable resistors or potentiometers may be varied with a second variation speed different from the first variation speed, particularly slower than the first variation speed.

In some embodiments, the magnetic multipole device simultaneously deflects the charged particle beam to a predetermined position on a specimen in the x-y-plane and corrects one or more beam aberrations of the charged particle beam, particularly astigmatism.

While the foregoing is directed to embodiments, other and further embodiments may be devised without departing from the basic scope thereof, and the scope thereof is determined by the claims that follow.

The invention claimed is:
1. A magnetic multipole device for influencing a charged particle beam propagating along an optical axis, comprising:
a first magnetic deflector for deflecting the charged particle beam in an x-direction, comprising a plurality of first saddle coils; and

16 a second magnetic deflector for deflecting the charged particle beam in a y-direction perpendicular to the x-direction, comprising a plurality of second saddle coils,
wherein the plurality of first saddle coils and the plurality of second saddle coils are arranged around the optical axis to provide a 12-pole magnetic corrector structure with 12 poles at uniformly spaced angular intervals,
wherein the plurality of first saddle coils comprises eight first saddle coils and the plurality of second saddle coils comprises eight second saddle coils, with four of the eight first saddle coils being provided at same angular intervals as four of the eight second saddle coils, resulting in the 12-pole magnetic corrector structure.

2. The magnetic multipole device according to claim 1, wherein the 12 poles are respectively provided by a first saddle coil, by a second saddle coil, or by a double coil comprising a first saddle coil overlapping with a second saddle coil.

3. The magnetic multipole device according to claim 1, wherein the 12 poles are configured to exert a beam correction field of a magnetic 12-pole corrector on the charged particle beam for correcting astigmatism of the charged particle beam.

4. The magnetic multipole device according to claim 1, wherein each saddle coil of the pluralities of first and second saddle coils covers an angle in a circumferential direction of 20° or more and 40° and less.

5. The magnetic multipole device according to claim 1, wherein the plurality of first saddle coils is arranged coaxially outside, or alternatively coaxially inside, the plurality of second saddle coils.

6. The magnetic multipole device according to claim 1, wherein the plurality of first saddle coils is connected to x-deflection current terminals of a current supply, particularly at least partially in a series connection, and/or the plurality of second saddle coils is connected to y-deflection current terminals of a current supply, particularly at least partially in a series connection.

7. The magnetic multipole device according to claim 1, the magnetic multipole device being configured to correct one or more beam aberrations of the charged particle beam by individually adjusting currents that flow through the 12 poles of the 12-pole magnetic corrector structure.

8. The magnetic multipole device according to claim 7, wherein the 12 poles are respectively provided by a first saddle coil, by a second saddle coil, or by a double coil comprising a first saddle coil overlapping with a second saddle coil, wherein an adjustable resistor or potentiometer is connected in parallel to each of the 12 poles for individually adjusting a current that flows therethrough.

9. The magnetic multipole device according to claim 1, the magnetic multipole device being configured to
(i) bi-axially deflect the charged particle beam in an x-y-plane by exciting the first magnetic deflector with an x-deflection current and the second magnetic deflector with an y-deflection current; and, simultaneously,
(ii) correct one or more beam aberrations of the charged particle beam by individually adjusting currents flowing through the pluralities of first and second saddle coils, or at least a subset thereof, for generating a predetermined beam correction field.

10. The magnetic multipole device according to claim 1, wherein first saddle coils and second saddle coils have a coil height along the optical axis of 10 mm or more and 50 mm or less.

11. The magnetic multipole device according to claim 1, further comprising a shielding that coaxially surrounds the first magnetic deflector and the second magnetic deflector, the shielding having a shielding height (H2) along the optical axis that is larger than a coil height (H) of the pluralities of first and second saddle coils along the optical axis.

12. A charged particle beam apparatus for inspecting or imaging a specimen with a charged particle beam, comprising:

a charged particle beam source for generating the charged particle beam;

an objective lens for focusing the charged particle beam on the specimen; and the magnetic multipole device for influencing the charged particle beam according to claim 1.

13. A magnetic multipole device for influencing a charged particle beam propagating along an optical axis, comprising:

a first magnetic deflector for deflecting the charged particle beam in an x-direction, comprising a plurality of first saddle coils with eight first saddle coils; and a second magnetic deflector for deflecting the charged particle beam in a y-direction perpendicular to the x-direction, comprising a plurality of second saddle coils with eight second saddle coils, wherein the plurality of first saddle coils and the plurality of second saddle coils are arranged around the optical axis to provide a 12-pole magnetic corrector structure with 12 poles at uniformly spaced angular intervals, with four of the eight first saddle coils being provided at same angular intervals as four of the eight second saddle coils, resulting in the 12-pole magnetic corrector structure.

14. A magnetic multipole device for influencing a charged particle beam propagating along an optical axis, comprising:

a first magnetic deflector for deflecting the charged particle beam in an x-direction, comprising a plurality of first saddle coils; and a second magnetic deflector for deflecting the charged particle beam in a y-direction perpendicular to the x-direction, comprising a plurality of second saddle coils, wherein the plurality of first saddle coils and the plurality of second saddle coils are arranged around the optical axis to provide a 12-pole magnetic corrector structure with 12 poles at uniformly spaced angular intervals, the plurality of first saddle coils comprises two sets of first saddle coils arranged on opposite sides of the optical axis in the y-direction, each set comprising four first saddle coils arranged next to each other in a circumferential direction, and the plurality of second saddle coils comprises two sets of second saddle coils arranged on opposite sides of the optical axis in the x-direction, each set comprising four second saddle coils arranged next to each other in the circumferential direction.

15. The magnetic multipole device according to claim 14, wherein each set of first saddle coils covers an angle of about 120° in the circumferential direction, and each set of second saddle coils covers an angle of about 120° in the circumferential direction.

16. The magnetic multipole device according to claim 14, wherein the two sets of first saddle coils and the two sets of second saddle coils overlap, with an overlap angle in the circumferential direction of about 30° in four overlap areas, respectively.

17. The magnetic multipole device according to claim 16, wherein each set of first saddle coils comprises two outer first saddle coils and two inner first saddle coils, and each set of second saddle coils comprises two outer second saddle coils and two inner second saddle coils, each outer first saddle coil overlapping with a respective outer second saddle coil in circumferential alignment therewith, such that four double coils are provided in the four overlap areas.

18. A method of influencing a charged particle beam propagating along an optical axis, comprising:

guiding the charged particle beam through a magnetic multipole device that comprises a first magnetic deflector with a plurality of first saddle coils and a second magnetic deflector with a plurality of second saddle coils, wherein the plurality of first saddle coils and the plurality of second saddle coils are arranged around the optical axis in a 12-pole magnetic corrector structure with 12 poles at uniformly spaced angular intervals, the plurality of first saddle coils comprising eight first saddle coils and the plurality of second saddle coils comprising eight second saddle coils, with four of the eight first saddle coils being provided at same angular intervals as four of the eight second saddle coils, resulting in the 12-pole magnetic corrector structure; and one or both of (i) deflecting the charged particle beam in an x-y-plane by applying an x-deflection current to the first magnetic deflector and a y-deflection current to the second magnetic deflector; and (ii) correcting one or more beam aberrations of the charged particle beam by individually adjusting currents that flow through the 12 poles for exerting a beam correction field on the charged particle beam.

19. The method according to claim 18, wherein the 12 poles of the 12-pole magnetic corrector structure are respectively provided by a first saddle coil, by a second saddle coil, or by a double coil comprising a first saddle coil overlapping with a second saddle coil, and the currents flowing through the 12 poles are individually adjusted via variable resistors or potentiometers.

20. The method according to claim 18, wherein the magnetic multipole device deflects the charged particle beam to a predetermined position on a specimen in the x-y-plane and simultaneously corrects an astigmatism of the charged particle beam.

* * * * *